United States Patent
Wu

(10) Patent No.: US 11,749,334 B2
(45) Date of Patent: Sep. 5, 2023

(54) MEMORY MANAGEMENT BASED ON TEMPERATURE AND STORAGE MEDIA AVAILABILITY

(71) Applicant: Micron Technology, Inc., Boise, ID (US)

(72) Inventor: Minjian Wu, Shanghai (CN)

(73) Assignee: Micron Technology, Inc., Boise, ID (US)

(*) Notice: Subject to any disclaimer, the term of this patent is extended or adjusted under 35 U.S.C. 154(b) by 282 days.

(21) Appl. No.: 17/328,316

(22) Filed: May 24, 2021

(65) Prior Publication Data

US 2022/0375510 A1    Nov. 24, 2022

(51) Int. Cl.
*G11C 11/406* (2006.01)
*G06F 11/30* (2006.01)
*G06F 1/20* (2006.01)

(52) U.S. Cl.
CPC ........ *G11C 11/40626* (2013.01); *G06F 1/206* (2013.01); *G06F 11/3037* (2013.01); *G06F 11/3058* (2013.01); *G06F 2201/81* (2013.01)

(58) Field of Classification Search
CPC .............. G11C 11/40626; G11C 16/10; G11C 2211/5641; G11C 7/04; G06F 1/206; G06F 11/3037; G06F 11/3058; G06F 2201/81; G06F 11/3013
See application file for complete search history.

(56) References Cited

U.S. PATENT DOCUMENTS

| 2019/0221253 A1* | 7/2019 | Gherman | G11C 7/04 |
| 2020/0027500 A1* | 1/2020 | Heymann | G01K 13/00 |

FOREIGN PATENT DOCUMENTS

WO       2021035436        3/2021

* cited by examiner

*Primary Examiner* — Ajay Ojha
(74) *Attorney, Agent, or Firm* — Greenberg Traurig

(57) ABSTRACT

Methods, systems, and apparatus related to memory management based on temperature evaluation and a status of storage media availability (e.g., whether usage of the storage media exceeds a threshold). In one approach, the memory management is implemented in a memory device having first and second memories. A controller of the memory device evaluates data from a temperature sensor to determine that a temperature of the memory device exceeds a normal operating range. Based on this evaluation, the controller selects the first memory (e.g., SLC memory) for storing incoming data. If the first memory becomes full, the controller switches to the second memory (e.g., TLC or QLC memory) for storing additional incoming data. When the temperature returns to the normal operating range, the additional data is re-written while in the normal operating range.

33 Claims, 4 Drawing Sheets

MEMORY MANAGEMENT BASED ON TEMPERATURE AND STORAGE MEDIA AVAILABILITY

FIELD OF THE TECHNOLOGY

At least some embodiments disclosed herein relate to memory devices in general, and more particularly, but not limited to management of memory devices based on temperature and storage media availability.

BACKGROUND

A system may include various kinds of memory devices and controllers that are coupled via one or more buses to manage information in numerous electronic devices such as computers, wireless communication devices, internet of things, cameras, digital displays, and the like. Memory devices are widely used to store information in such electronic devices. Information is stored by programing different states of a memory cell. For example, binary memory cells may store one of two states, often denoted by a logic "1" or a logic "0." Some memory cells are capable of storing one of more than two states. To access the stored information, the memory device may read, or sense, the stored state in the memory cell. To store information, the memory device may write, or program, the state to the memory cell.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory, flash memory (such as floating-gate flash and charge-trapping flash, which may be used in not-or (NOR) or not-and (NAND) memory devices), and others. Memory devices may be volatile or non-volatile. Non-volatile memory cells (e.g., flash memory cells) may maintain their stored logic state for extended periods of time even in the absence of an external power source. Volatile memory cells (e.g., DRAM cells) may lose their stored state over time unless they are periodically refreshed by an external power source. Flash-based memory devices may have improved performance compared to some non-volatile and volatile memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
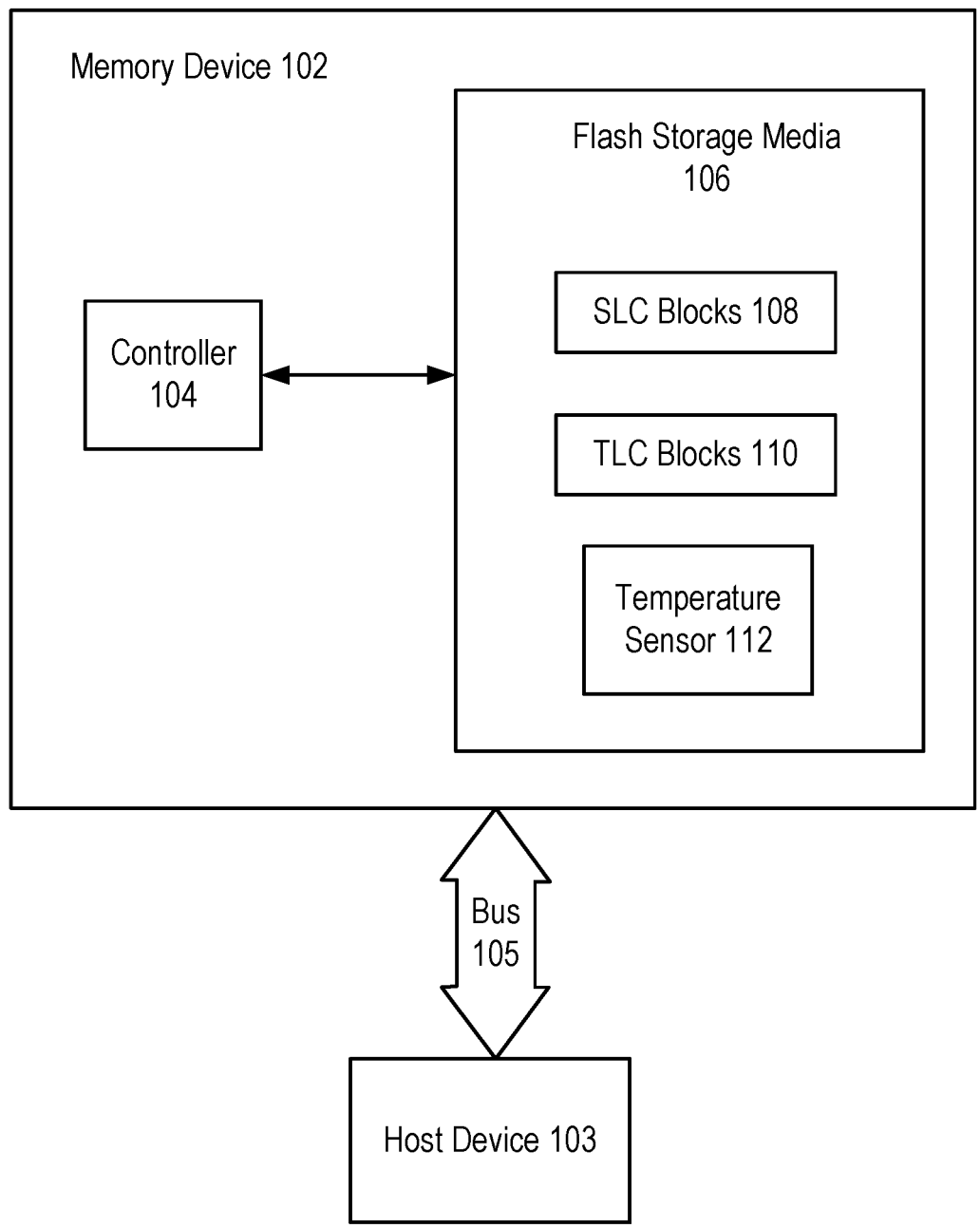
FIG. 1 shows a memory device that manages storage of data based on temperature and storage media availability, in accordance with some embodiments.

The following disclosure describes various embodiments for management of a memory device by a controller that determines a temperature of the memory device based on data from one or more sensors, and that determines an availability status of storage media for storing data (e.g., a status that the storage media is presently full, a status that usage of the storage media exceeds a threshold, a status that the storage media will become full if a pending write command is executed, or a status that the storage media is available to store additional data). At least some embodiments herein relate to management of a flash memory device (e.g., using a NAND storage media) that includes a temperature sensor. The foregoing memory devices may, for example, store data used by a host device (e.g., a computing device of an autonomous vehicle, or a computing device of another type of electronic system, that accesses data stored in the memory device). In one example, the memory device is a solid-state drive mounted in an electric vehicle.

In some cases, a memory device may experience a wide range of operating temperatures, potentially including relatively extreme (high or low) temperatures. Operating the memory device under such conditions may increase the likelihood of errors in the memory device, which may be particularly problematic for systems (such as automotive applications or other systems) where accuracy and reliability are critical (e.g., related to safety).

Some types of memory cells used in memory devices are capable of storing a single bit of information in each memory cell. Such memory cells are often referred to as single-level cells (SLCs). Some types of memory cells are capable of storing two or more bits of information in each memory cell. Such memory cells are often referred to as multiple-level cells, and may include, for example, memory cells capable of storing two bits, three bits, four bits, etc. Memory cells that store two bits are sometimes referred to as multi-level cells (MLCs), though this term is sometimes also used to refer to any memory cell that stores more than one bit. Memory cells that store three bits may be referred to as triple or tri-level cells (TLCs), and memory cells that store four bits may be referred to as quad-level cells (QLCs), etc. Multiple-level cells, such as MLCs, TLCs, and QLCs, may provide cost and/or density advantages relative to SLCs. On the other hand, SLCs may be faster and more reliable than multiple-level cells. In some cases, not-AND (NAND) memory cells may be configured or operated as SLCs or as multiple-level cells.

In general, the more bits stored in a memory cell, the more sensitive the memory cell may be to noise or other disturbances such as those that may arise under relatively extreme operating conditions. Thus, for example, an SLC may be more robust to extreme temperatures than a multiple-level cell, but may cost more and provide less density. Similarly, an MLC cell may be more robust than a TLC cell, and a TLC cell may be more robust than a QLC cell. Some safety-critical systems, such as those used in automotive applications, rely on SLC-based memory to improve system reliability. However, this approach may increase the cost of the system and may not leverage the density advantages of multiple-level memory cells.

As described for some embodiments below, a memory device (e.g., a NAND memory device) may include both SLC memory (or another type of highly reliable memory) and multiple-level cell memory (or another type of high-density or low-cost memory). The memory device may determine which type of memory to use based on, for example, the temperature of the memory device. In one example, the memory device is configured to write data to SLC memory blocks when the memory device is operating under relatively extreme temperatures, and to write data to multiple-level cell memory when the memory device is operating within a less extreme temperature range. In this manner, a memory device provides improved reliability under a range of operating conditions, while providing lower cost and higher density compared to SLC-only designs.

One problem that occurs when storing data at more extreme temperatures (e.g., storing data for a memory device in a vehicle operating at Arctic or desert temperatures) is known as the cross-temperature effect. For example, data written at an extreme cold temperature will result in increased errors when read at hot temperatures, and vice versa.

For example, the cross-temperature effect is one of the adverse factors that can limit 3D-TLC NAND Flash reliability and performance. The physical nature of the phenomenon is related to the temperature dependency of the threshold voltage distributions that is observed when data is read from memory when at a temperature that is different from the temperature of the memory during when programming the data. In one example, for an automotive system, normally the lowest ambient temperature is −40° C., and the highest temperature can be 85° C. or higher. In one example, there are two corner cases of cross-temperature profiles: one is writing data at −40° C. and reading data at 105° C.; another is writing data at 105° C. and reading data at −40° C. This wide cross-temperature range from −40° C. to 105° C. is a significant challenge for the reliability of TLC NAND when applied in automotive implementations.

At least some embodiments described herein address the above problems by writing data into SLC blocks when the temperature of a memory device is extreme (e.g., outside of a normal range). Then, once the temperature of the memory device is inside a normal range, the data is flushed into TLC blocks. In one example, this approach is implemented through Universal Flash Storage (UFS) temperature event notification and/or thermal throttling features.

In some cases, when SLC memory is used for writing data at extreme temperatures, the SLC memory can become full. For example, an SLC block pool can become filled with data and thus exhausted when a system or application of a vehicle is sending large quantities of data to a memory device for storage, and the quantity to be stored exceeds the capacity of the SLC block pool. This causes a technical problem in which data can no longer be stored, or is stored less reliably.

To address the above problem of the SLC memory being exhausted, when a memory device that is operating at an extreme temperature has selected SLC memory for storing data, and the SLC memory becomes full, additional data being received (e.g., received from a host device of a vehicle) for storage while at the extreme temperature is temporarily stored in TLC memory. The data stored in the TLC memory is flagged to indicate its temporary status. Once the memory device returns to a normal operating temperature, the data stored in the TLC memory is refreshed (e.g., by re-writing the data into the TLC memory). By refreshing the data when at the normal operating temperature, the cross-temperature effect is reduced so that the data can be read with increased reliability.

In one embodiment, a vehicle uses temperature and data condition-based buffer management. When the vehicle encounters an extreme condition where the temperature of a data storage device is high, and the amount of data coming into the storage device is also high, a buffer that can tolerate the condition may be full. For example, a single-level cell (SLC) block pool may be full. Yet, there is additional data to be buffered for committing into the data storage device. In such a situation, a triple-level cell (TLC) buffer of the storage device (e.g., a TLC block pool) can be used to temporarily store the additional data with a flag (e.g., the data is marked with the flag). The flag indicates the data is stored with a temporary status due to an actual or expected increased unreliability of the data (e.g., when later read). As the temperature of the data storage device is brought back into or toward the normal range, the content of the triple-level cell (TLC) buffer can be retrieved at temperatures with reduced cross-temperature effect, and re-written (e.g., into another portion of TLC memory) at temperatures inside a normal temperature range. Thus, through the re-buffering and/or re-writing operations of the flagged data in the TLC memory, the additional data can be eventually written into the data storage device in the normal temperature range.

Advantages provided by various embodiments described herein include improving the cross-temperature reliability of memory devices. For example, the cross-temperature reliability of 3D TLC UFS devices is improved. When the temperature of the UFS device is very high or very low (e.g., outside of a defined normal operating range), the data is written into SLC blocks of the UFS device, but once the temperature becomes normal, the data is flushed into TLC blocks of the UFS device. When the SLC blocks are exhausted when at an excessive temperature, overflow data is temporarily stored in the TLC blocks, and then later refreshed when the temperature is inside the defined normal operating range.

FIG. 1 shows a memory device 102 that manages storage of data based on temperature and storage media availability, in accordance with some embodiments. Examples of memory device 102 may include media playback devices, such as DVD, CD and MP3 players, and media recording devices. Further examples of media devices include wirelessly-connected media devices, wireless media players, digital media players, streaming media boxes, network-connected media players, etc.

In one embodiment, memory device 102 stores data for an infotainment system of a vehicle. For example, various applications are installed on the infotainment system, multiple high-resolution screens can be supported, and/or video data from a camera can be recorded. These applications can introduce an increasing density requirement for a storage device of the infotainment system. For example, due to the trend of lower cost for high-density storage solutions, 3D TLC UFS devices are increasingly used in automotive systems.

Memory device 102 includes controller 104 and flash storage media 106. Flash storage media 106 is, for example, a NAND flash storage media. Controller 104 controls the operation of various functions implemented for the operation of storage media 106. For example, controller 104 manages read, write, and erase operations for storage media 106. These operations may be performed in response to various signaling received from host device 103 over communication bus 105 (e.g., a serial bus). In one example, the signaling includes write commands from host device 103. The write command corresponds to data sent over bus 105 to memory device 102 for storage in flash storage media 106. Controller 104 selects a region of flash storage media 106 in which to store the received data.

In one embodiment, flash storage media 106 includes various regions or portions (e.g., regions of different memory types). For example, these regions include SLC blocks 108 and TLC blocks 110. Under normal operating conditions, incoming data from host device 103 is stored in TLC blocks 110. This is typically done due to the higher storage density of TLC blocks 110 as compared to SLC blocks 108.

When new data to be stored is received by memory device 102, controller 104 determines an operating temperature of flash storage media 106. In one embodiment, controller 104 receives data from temperature sensor 112. The received data is used by controller 104 to determine the operating temperature. In one example, controller 104 determines the operating temperature based on an output from a machine-learning model that uses data from temperature sensor 112 as an input. In one example, the machine-learning model is an artificial neural network.

In one example, temperature sensor 112 is on a same chip as flash storage media 106. In one example, temperature sensor 112 is located inside an enclosure of memory device 102 that includes flash storage media 106. In one example, controller 104 is on the same chip as flash storage media 106.

If controller 104 determines that the operating temperature is inside a normal range, then controller 104 selects TLC blocks 110 for storing incoming data. If controller 104 determines that the operating temperature is outside a normal range, then controller 104 selects SLC blocks 108 for storing incoming data.

In some cases, controller 104 determines that SLC blocks 108 are no longer available for storing data. For example, the SLC blocks 108 may be exhausted due to being filled to capacity with previously-stored data. Thus, in some cases, incoming data to be stored that is received when the operating temperature is outside the normal range cannot be stored in SLC blocks 108.

In one example, controller 104 monitors the storage capacity of SLC blocks 108. In one example, controller 104 determines as part of this monitoring whether the number of used SLC blocks is greater than a defined threshold (e.g., 95% of total SLC blocks). For example, the defined threshold may be stored in memory of controller 104, or stored in flash storage media 106. In one example, the defined threshold is received from host device 103 and stored by controller 104 for future use.

In one embodiment, controller 104 determines whether SLC blocks 108 are available to store new incoming data based on a quantity or size (e.g., number of blocks, bytes, or bits) of the new data to be stored. For example, controller 104 may determine that a size of the new data exceeds a remaining capacity of SLC blocks 108. In such case, controller 104 determines that SLC blocks 108 are not available to store the new data. Instead, controller 104 selects TLC blocks 110 for storing the new data.

If controller 104 determines that the defined threshold has been exceeded so that SLC blocks 108 are not available to store data, then controller 104 selects TLC blocks 110 for temporary storage of additional incoming data being received from host device 103 (e.g., when the temperature is above a $T_{high}$ boundary). The additional data is stored in TLC blocks 110 and flagged. Flagging the additional data indicates that the data is being stored temporarily, for example, because the data is potentially less reliable due to being written at an extreme temperature. In one example, the data is potentially less reliable because cross-temperature effects are expected to potentially result in errors when reading the data at other, significantly different temperatures, in particular temperatures at an opposite extreme from which the data is programmed.

In one example, the flag is stored in memory of controller 104. In one example, the flag is stored in a portion of the flash storage media 106. In one example, the flag is additionally and/or alternatively stored at host device 103.

After the additional data is stored, controller 104 determines that the operating temperature of memory device 102 has returned to a normal operating range. In response to this determination, controller 104 identifies previously-stored data that was stored with a flag set to indicate the data was stored at a temperature outside the normal operating range (e.g., at a temperature greater than or equal to a threshold value). In some embodiments, the flag is set by configuring a register or portion of memory (into which the data is written) with an indicator. Then, controller 104 refreshes the identified, flagged data. For example, the additional data above is refreshed in the TLC blocks 110 when the temperature is back within the normal operating range. Refreshing the data increases the reliability of the data for future use, in part by reducing cross-temperature effects.

In one example, the additional data is refreshed by moving the data from one portion of TLC blocks 110 to another portion of TLC blocks 110. In one example, the additional data is refreshed by copying the data from TLC blocks 110 to a temporary buffer (not shown) of memory device 102, and then re-writing the data back into TLC blocks 110. After the additional data is refreshed, the flag is cleared. In some embodiments, the flag is cleared by reconfiguring the register or portion of memory with the indicator above. Controller 104 refreshes other identified, flagged data in a similar manner.

In addition to the above, data that has been stored in SLC blocks 108 when the operating temperature is outside a normal range (e.g., stored prior to SLC blocks 108 becoming exhausted) can also be refreshed. For example, controller 104 can refresh data from SLC blocks 108 to TLC blocks 110 and/or other TLC blocks of memory device 102 once controller 104 determines that the operating temperature has returned to a defined range (e.g., a normal or nominal operating range set by controller 104 in response to data received from host device 103, such as a low temperature value and a high temperature value used to set boundaries for the normal range).

In one example, memory device 102 is a UFS device that includes controller 104 and flash storage media 106 as several NAND dies in one package. Each NAND die integrates a temperature sensor 112 that is used to monitor its internal temperature. UFS firmware runs on controller 104 to handle the NAND device operations, data mapping from host to NAND, wear-leveling and garbage collection, etc. Normally, TLC NAND flash provides an SLC mode to operate TLC flash as SLC flash at the block level. An advantage of SLC mode achieving better reliability performance (e.g., for cross-temperature reliability), but the density of NAND is decreased.

In one example, data is programmed into NAND inside the above UFS device. When the temperature is greater than $T_{low}$ and less than $T_{high}$, the data is programmed into normal TLC blocks, but when the temperature is under an extreme condition (less than $T_{low}$ or greater than $T_{high}$) and the SLC block pool is available, the data is programmed into these dedicated SLC blocks (e.g., which are always used with an SLC mode). Once there is no available SLC block remaining in the pool, data is programmed into TLC blocks, but the data is marked with an unreliable flag.

When the SLC block pool is filled with data under extreme temperature, it may become exhausted. Optionally, an alert notification is reported to the host device 103 when the number of used SLC blocks is greater than a defined threshold. This indicates to host device 103 that the subsequent read/write performance may be reduced to save power, and the reliability performance may be reduced as the data will be written into TLC blocks and marked with unreliable flags (after all these dedicated SLC blocks are used up).

In one embodiment, when the temperature becomes normal, a priority of controller 104 is to refresh all data marked with the unreliable flags in TLC data blocks. Then, the data in the SLC block pool are also moved to TLC blocks.

In one example, the Temperature Event Notification feature as defined in the storage standard for Universal Flash Storage (UFS) 3.0 is used. This feature provides notification to host device 103 in advance when the UFS device temperature approaches a defined upper or lower boundary of temperature. For example, in order to give temperature boundary information for too high or too low temperature alarming, bDeviceTooHighTempBoundary and bDeviceTooLowTempBoundary are defined. These two parameters can be, for example, equivalent to $T_{high}$ and $T_{low}$ above.

In one example, a specific command can be implemented for a user to modify the set values of $T_{high}$ and $T_{low}$. When this temperature alarming is raised, host device 103 may desire to know the temperature reported by the UFS device through a bDeviceCaseRoughTemperature attribute. Based on this temperature information, host device 103 can determine if cooling or heating activities are to be performed for decreasing or increasing, for example, the UFS device's Tcase temperature.

In one example, the Performance Throttling Event Notification feature as defined in UFS 3.1 can be used. If the UFS device needs to reduce performance, the host device will be notified through the Exception Event Mechanism. From the UFS firmware algorithm, when the internal SLC buffer is almost full (e.g., the used SLC blocks exceed a defined threshold), a PERFORMANCE_THROTTLING exception event bit is set to report this info to the host device. The performance of the UFS device is reduced, since TLC blocks are used for data that is stored temporarily and numerous refresh operations are expected. For a user application executing on the host device, the host device may reduce the write data size by restricting some system functions.

In some embodiments, a controller (e.g., controller 104) may identify data to write to a memory device that includes memory cells of a first type and memory cells of a second type. For example, memory cells of the first type may be SLC memory cells, and memory cells of the second type may be multiple-level memory cells. For example, memory cells of the first type and memory cells of the second type may be two different types of NAND memory cells.

The controller may identify a temperature of the memory device based on, for example, a signal received from a temperature sensor (e.g., 112). The controller may select a type of memory cell from a set of memory cell types based at least in part on the temperature of the memory device, where the set of memory cell types includes the first type and the second type. For example, the set of memory cell types may include SLC memory cells, MLC memory cells, TLC memory cells, QLC memory cells, etc. The controller may write the data to one or more memory cells of the selected type based at least in part on selecting the type of memory cell from the set of memory cell types. In this manner, the controller may, under normal operating conditions, write the data to high-density, low-cost memory cells, while the controller may, under extreme operating conditions, write the data to high-reliability memory cells.

In one example, a memory device (e.g., 102) determines that a first type of memory blocks (e.g., SLC blocks 108) exceeds a threshold amount of stored data. Then, the memory device may transmit a message (e.g., to host device 103) indicating that the first type of memory blocks exceeds the threshold amount of data. For example, the message may indicate that the first type of memory blocks are full or nearly full (e.g., that the available capacity of the first type of memory blocks is below a threshold capacity, or that memory cells in the first type of memory blocks are not available to store additional data, or that the quantity of the memory cells of the first type that are available to store additional data is below the threshold). In some cases, the host device may respond to the message by, for example, reducing the amount of data that is written to memory, instructing the memory device to store the data elsewhere, reducing the clock speed of the memory device, or entering a read-only mode until the temperature drops back into the nominal temperature range. In some cases, the host device may configure the memory device with one or more threshold amounts of data such that the memory device may send an error message indicating when the usage of the first type of memory blocks has satisfied each configured threshold amount of data, thereby providing progressive indications of the remaining capacity in the first type of memory blocks.

Figure 2:
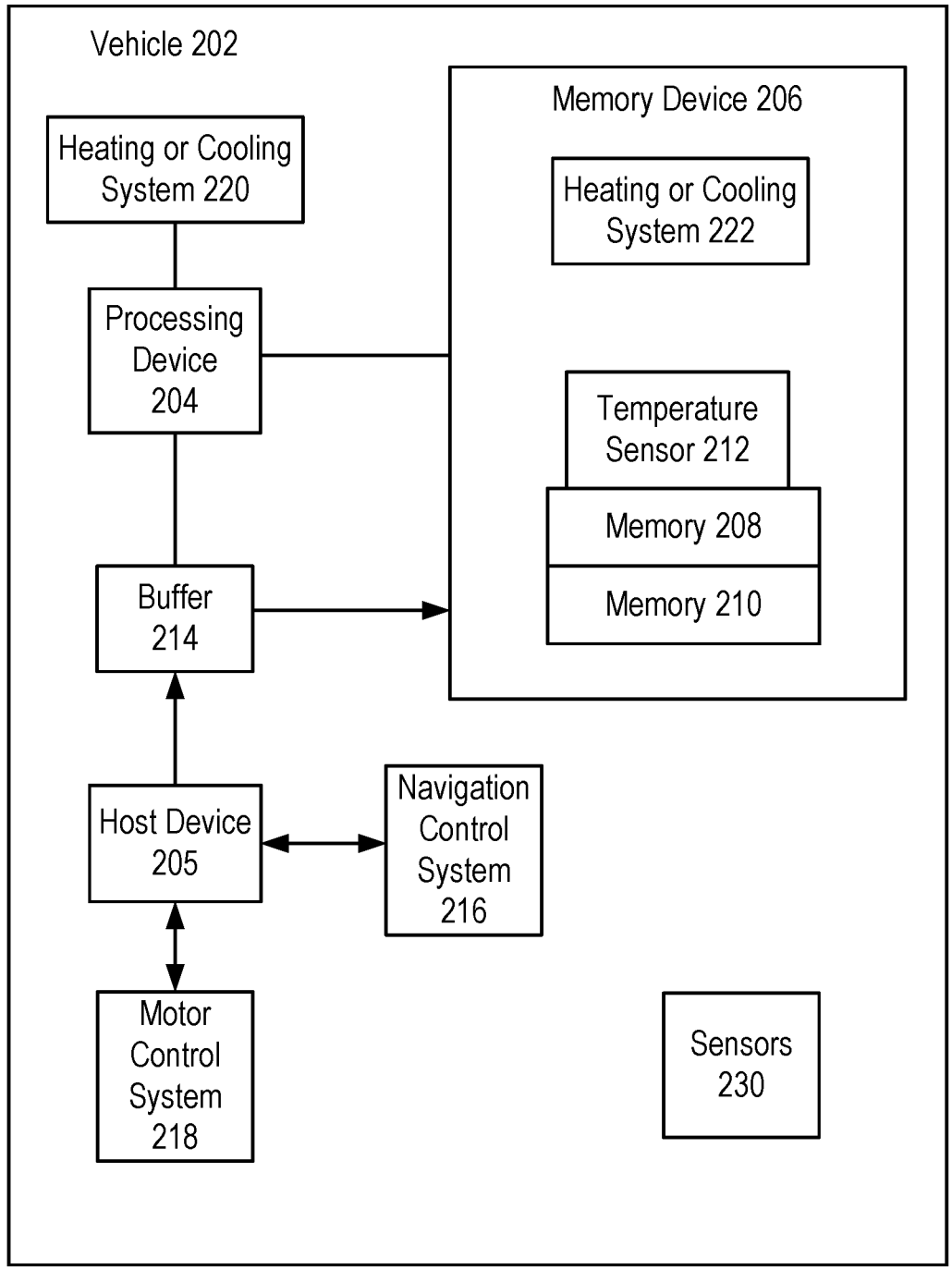
FIG. 2 shows a vehicle including a memory device having a temperature sensor used for managing data storage, in accordance with some embodiments.

FIG. 2 shows a vehicle 202 including a memory device 206 having a temperature sensor 212 used for managing data storage, in accordance with some embodiments. Memory device 206 is an example of memory device 102. Temperature sensor 212 is an example of temperature sensor 112. Operations of memory device 206 can be controlled by processing device 204 and/or a local controller (not shown) of memory device 206. Processing device 204 is an example of controller 104.

In one embodiment, memory device 206 stores data received from host device 205 (e.g., data from a camera (not shown) of vehicle 202). In one example, memory device 206 stores data for applications running on host device 205. In one example, one or more of the applications are associated with or implement an infotainment system (not shown) of vehicle 202. Host device 205 is an example of host device 103.

In one embodiment, processing device 204 controls buffer 214, which receives incoming data from host device 205 that is to be stored in memory device 206 and/or other memory devices. Host device 205 can send various commands to processing device 204 indicating operations to be performed on memory device 206. In one example, the operation is programming of data provided by host device 205. In one example, host device 205 sends a write command to processing device 204, and the data to be written is loaded by host device 205 into buffer 214.

In response to receiving the write command, processing device 204 selects a portion of memory device 206 for use in storing the data. For example, processing device 204 selects either memory 208 or memory 210 for storing incoming data from host device 205. In one example, memory 208 is SLC blocks 108. In one example, memory 210 is TLC blocks 110.

In one embodiment, memory 210 (e.g., TLC memory) is selected when a temperature of memory device 206 is in a normal operating range. Memory 208 (e.g., SLC memory) is selected when a temperature of memory device 206 is outside the normal operating range.

In one example, memory 208 and memory 210 have memory cells of different types. For example, memory 208 may have resistive memory cells, and memory 210 may have flash memory cells (e.g., arranged in a 3D architecture). In one example, memory 208 and memory 210 each have TLC cells, but memory 208 has a higher reliability then memory 210 based on performance monitoring that has been performed during operation of memory device 206 to determine real-time error rates. In one example, the reliability is determined based on a respective error rate when reading data from memory 208 and memory 210.

In one embodiment, each of memory 208, 210 is a separate chip, and each memory 208, 210 has its own temperature sensor 212. In one embodiment, temperature sensor 212 is on a separate chip or physical component from memory 208, 210. Each temperature sensor 212 provides data indicative of a temperature of respective memory 208, 210. The data is provided to processing device 204 by, for example, a local controller of memory device 206.

To determine whether a temperature of memory device 206 is inside or outside of a defined normal operating range, processing device 204 uses data from one or more temperature sensor(s) 212. Based on evaluating this data, processing device 204 determines that the temperature is outside of the defined operating range (e.g., for one or more respective memories of memory device 206). In response to this determination, processing device 204 selects memory 208 (e.g., SLC memory) for storing data. As a result, data received from host device 205 and stored in buffer 214 is written to memory 208.

If a sufficient quantity data is written to memory 208, then memory 208 eventually becomes full. In response to processing device 204 determining that memory 208 is full or will become full based on used blocks exceeding a threshold (e.g., as discussed above), processing device 204 begins writing new incoming data from buffer 214 to memory 210 (e.g., TLC memory). The new data is flagged as temporary (e.g., due to being potentially unreliable).

Subsequently, processing device 204 determines based on data from one or more temperature sensor(s) 212 that the temperature of memory device 206 is inside of the defined normal operating range. In response to this determination, the new data flagged as temporary is refreshed. In one example, the new data is moved from one group of TLC blocks to another group of TLC blocks. The new data is moved (e.g., re-written or re-programmed) while the temperature is inside the defined normal operating range. After the new data is refreshed (e.g., as described above), the flag is cleared.

In one embodiment, the temperature operating range for memory device 206 is determined based on an operating status of vehicle 202. The operating status can be determined based on data from one or more sensors 230 of vehicle 202 and/or temperature sensor(s) 212. Sensors 230 may include temperature sensors separate from memory device 206, and/or sensors that monitor operating conditions associated with a motor, infotainment system, or other hardware system of vehicle 202. Based on determining the operating status of the vehicle, the temperature operating range for memory device 206 can be adjusted. The operating status can be determined, and the temperature operating range adjusted, by processing device 204 and/or host device 205.

In one example, the operating status is determined to be that vehicle 202 is powered for travel along the road. For example, vehicle 202 is in a powered-on state in which a motor of the vehicle is receiving power for normal vehicle acceleration.

Host device 205 controls the operation of motor control system 218 and navigation control system 216. Host device 205 receives data from systems 216, 218 during operation of vehicle 202. At least portions of this data are sent to buffer 214 for storing in memory device 206. This data can also include data collected by sensors of either, or both, systems 216, 218.

In one embodiment, in response to determining that the temperature of memory device 206 is outside of a defined operating range, one or both of heating or cooling systems 220, 222 of vehicle 202 can be activated (e.g., to heat or cool memory device 206, or a specific memory chip or portion thereof). In one example, cooling system 220, 222 is an air conditioning system, or a fan. System 220 is external to memory device 206, and system 222 is inside an enclosure (e.g., packaging) of memory device 206. In one embodiment, processing device 204 controls one or both of systems 220, 222 to return the temperature of memory device 206 to a normal operating range.

Figure 3:
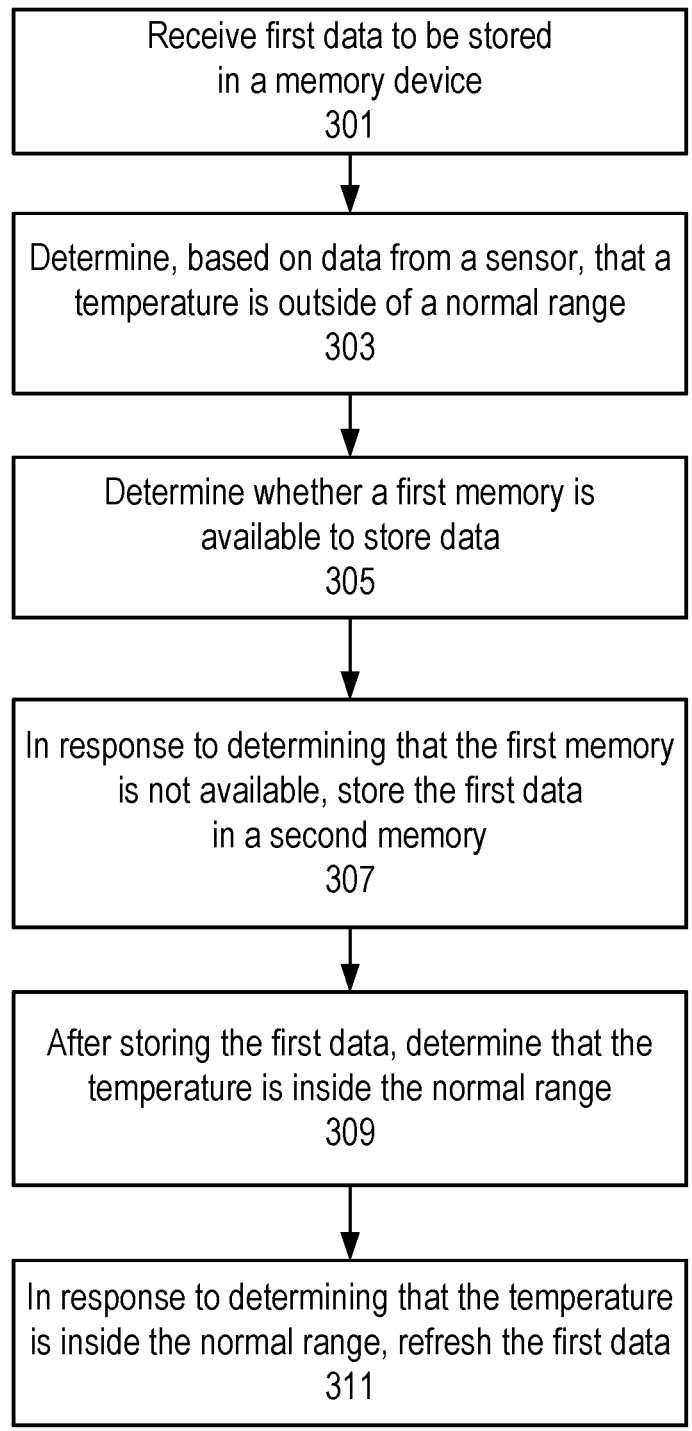
FIG. 3 shows a method for memory management based on temperature and storage media availability, in accordance with some embodiments.

FIG. 3 shows a method for memory management based on temperature and storage media availability, in accordance with some embodiments. For example, the method of FIG. 3 can be implemented in the system of FIG. 1. In one example, controller 104 evaluates data from temperature sensor 112 for selecting a type of memory of a memory device to use for storing data in extreme temperatures. If the first type of memory becomes exhausted, then controller 104 selects a second type of memory for temporary storing of the data while the extreme temperature condition exists. When controller 104 determines (e.g., using data from temperature sensor 112 and/or other data) that the temperature of the memory device has returned to a normal range, the temporarily stored data is refreshed.

The method of FIG. 3 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 3 is performed at least in part by one or more processing devices (e.g., controller 104 of FIG. 1).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 301, first data to be stored in a memory device is received. In one example, a command and corresponding data to be stored in memory device 102 are received from host device 103.

At block 303, based on data from one or more sensors, a determination is made that the temperature is outside of a normal range. In one example, data from temperature sensor 212 and/or sensors 230 is evaluated to determine that the temperature is outside of a normal operating range previously defined by host device 103.

At block 305, a determination is made whether a first memory is available to store data. In one example, controller 104 determines whether a number of blocks used by SLC blocks 108 based on previously-stored data exceeds a threshold number.

At block 307, in response to determining that the first memory is not available, the first data is stored in a second memory. In one example, controller 104 determines that SLC blocks 108 is exhausted, and in response to this determination, selects TLC blocks 110.

At block 309, after storing the first data, a determination is made that the temperature is inside the normal range. In one example, processing device 204 or host device 205 determines that the temperature is inside the normal range. In one example, this determination is made based on data from sensors 230. In one example, the host device signals a controller in the memory device that this determination has been made.

At block 311, in response to determining that the temperature is inside the normal range, the first data is refreshed. In one example, the first data is moved from a temporary portion of TLC blocks 110 to a permanent portion of TLC blocks 110.

In one embodiment, a memory device (e.g., 102, 206) includes: first memory (e.g., 108, 208) having memory cells, each cell configured to store a single bit; second memory (e.g., 110, 210) having memory cells, each cell configured to store two or more bits; a temperature sensor (e.g., 112, 212); and a controller (e.g., 104, 204) configured to: receive signaling (e.g., a write command from host device 103) corresponding to first data to be stored; determine, based on data from the temperature sensor, whether a temperature of the memory device is outside of a range; in response to determining that the temperature of the memory device is outside of the range, determine a status of the first memory to store data; in response to determining that the first memory is full or will become full, or usage exceeds a threshold, store the first data in the second memory, and set a flag associated with the first data; after storing the first data in the second memory, determine that the temperature of the memory device is inside the range; and in response to determining that the temperature is inside the range, refresh the first data, and clear the flag.

In one embodiment, the first data is stored in a first portion of the second memory; and refreshing the first data includes moving the first data to a second portion of the second memory.

In one embodiment, determining whether the temperature of the memory device is outside of the range is performed in response to receiving the signaling; and a determination is made that the first memory will become full if a write command is executed (e.g., the determination is made based on a size of the first data to be stored in response to receiving the write command).

In one embodiment, the flag is set to indicate that the first data is potentially unreliable, and the flag is cleared to indicate that the first data has been refreshed when the temperature is inside the range.

In one embodiment, the first memory is a portion of the second memory, and operation of the portion is configured (e.g., configured by controller 104 or a local controller of the memory device) so that each memory cell in the portion stores a single bit.

In one embodiment, the first data is received from a host device (e.g., 103), and the range is determined by the controller based on a low temperature and a high temperature received from the host device.

In one embodiment, second data has been stored in the first memory when the temperature of the memory device is outside of the range; and the controller is further configured to, in response to determining that the temperature is inside the range, move the second data from the first memory to the second memory.

In one embodiment, the memory device is a flash storage device (e.g., NAND memory), the memory cells of the first memory are single-level cells, and the memory cells of the second memory are triple-level cells.

In one embodiment, determining the status of the first memory includes determining a capacity of the first memory (e.g., determining that a number of used blocks is greater than a threshold).

In one embodiment, the first data is received from a host device, and the controller is further configured to send, to the host device, an indication of the capacity of the first memory (e.g., an indication that the number of used blocks is greater than the threshold).

In one embodiment, the host device, in response to receiving the indication, reduces an extent of at least one of read or write commands sent to the memory device.

In one embodiment, the controller is further configured to: receive second data to be stored; and in response to determining that the temperature is inside the range, store the second data in the second memory.

In one embodiment, the temperature sensor is configured to monitor an internal temperature of the memory device.

In one embodiment, the range is −20 to +70 degrees Celsius. In one example, the low temperature is −10 degrees Celsius, and the high temperature is 60 degrees Celsius. Higher or lower values can, for example, be set for $T_{low}$ or $T_{high}$.

In one embodiment, a method includes: receiving first data to be stored in a memory device, the memory device includes first memory (e.g., 108, 208) and second memory (e.g., 110, 210); determining, based on data from at least one sensor of the memory device, whether a temperature is outside of a defined range; in response to determining that the temperature is outside of the defined range, determining whether the first memory is full or that usage exceeds a threshold; in response to determining that the first memory is full or that usage exceeds the threshold, storing the first data in the second memory; after storing the first data, determining that the temperature is inside the defined range; and in response to determining that the temperature is inside the defined range, refreshing the first data.

In one embodiment, the method further includes setting a flag to indicate a temporary status of the stored first data; and after refreshing the first data, clearing the flag.

In one embodiment, the memory device is mounted in a vehicle (e.g., 202), and the method further includes: determining an operating status of the vehicle; and adjusting, based on the determined operating status of the vehicle, the defined range.

In one embodiment, determining the operating status includes determining that the vehicle is powered for travel along a road.

In one embodiment, the method further includes, in response to determining that the temperature is outside of the defined range, causing activation of an air conditioning system (e.g., 220, 222) that cools the memory device.

Figure 4:
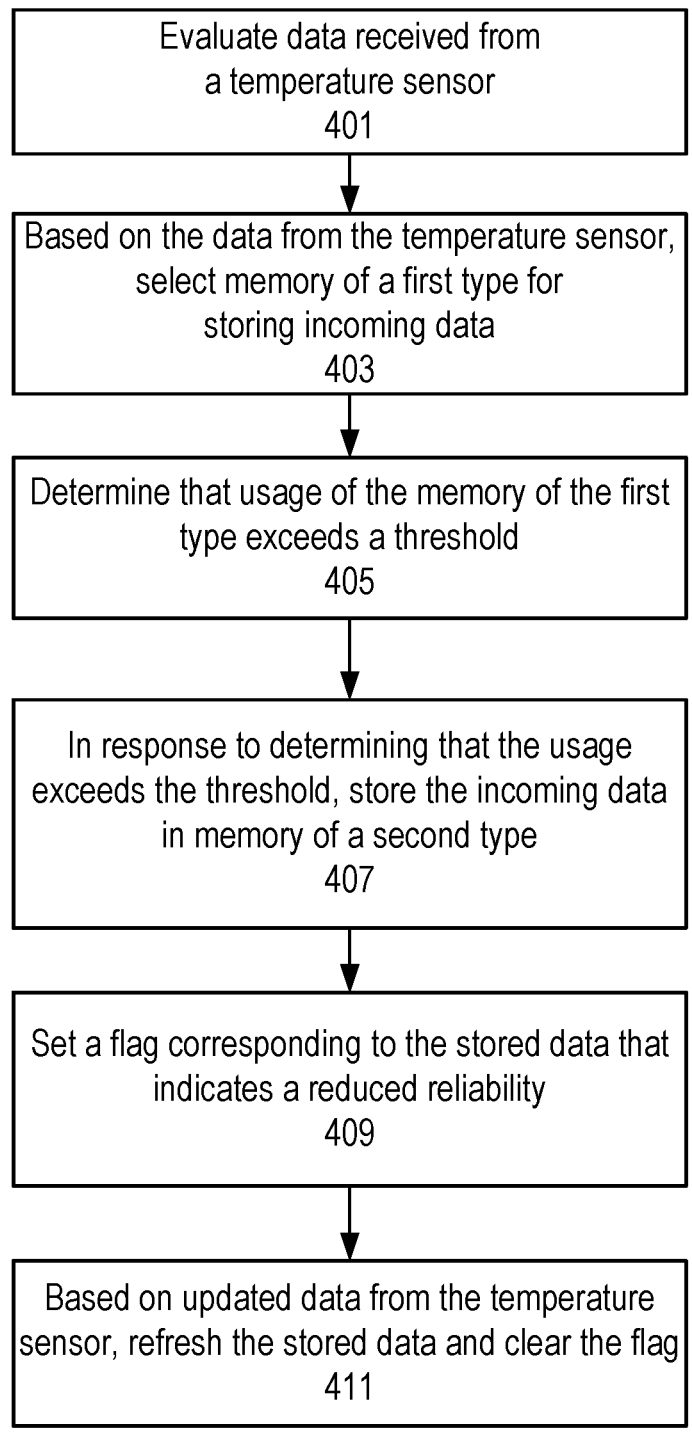
FIG. 4 shows a method for memory management based on evaluating data received from a temperature sensor, in accordance with some embodiments.

FIG. 4 shows a method for memory management based on evaluating data received from a temperature sensor, in accordance with some embodiments. For example, the method of FIG. 4 can be implemented in the system of FIG. 2. In one example, processing device 204 evaluates data received from temperature sensor(s) 212. Optionally, processing device 204 can additionally and/or alternatively evaluate data received from other sensors and/or sources of data for performing memory management, including temperature determination and/or selecting a portion or type of memory to use for storing incoming data from host device 205.

The method of FIG. 4 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 4 is performed at least in part by one or more processing devices (e.g., processing device 204 of FIG. 2).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 401, data received from a temperature sensor is evaluated. In one example, the temperature sensor is temperature sensor 112.

At block 403, based on the data from the temperature sensor, a memory of a first type is selected for storing incoming data. In one example, the memory of the first type is SLC blocks 108.

At block 405, a determination is made that usage of the memory of the first type exceeds a threshold. In one example, the SLC blocks 108 are exhausted because filled.

At block 407, in response to determining that the usage exceeds the threshold, the incoming data is stored in memory of a second type. In one example, the memory of the second type is TLC blocks 110, which is selected by controller 104.

At block 409, a flag is set corresponding to the stored data that indicates reduced reliability of the data. In one example, the flag is a bit stored in memory of controller 104. In one example, the flag is stored in a register or other memory of flash storage media 106. In one example, the flag is stored in memory device 206, and/or host device 205.

At block 411, based on updated data that is received from the temperature sensor, the stored data is refreshed, and the flag is cleared.

In one embodiment, a system includes: a temperature sensor (e.g., 212); and a processing device (e.g., 204) configured to: evaluate data received from the temperature sensor; select, based on evaluating the data received from the temperature sensor, a first memory (e.g., 208) for storing data; after selecting the first memory, determine that usage of the first memory exceeds a threshold; in response to determining that the usage exceeds the threshold, store first data in a second memory (e.g., 210); and set a flag corresponding to the first data stored in the second memory, the flag indicating a reduced reliability of the first data.

In one embodiment, a memory device (e.g., 206) includes the first memory and the second memory (e.g., the first and second memory are part of the same semiconductor chip); and evaluating the data includes determining that a temperature of the memory device is outside of a defined operating range. The processing device is further configured to: receive new data from the temperature sensor; determine, based on the new data, that the temperature of the memory device is inside the defined operating range; in response to determining that the temperature of the memory device is inside the defined operating range, move the first data from a first portion of the second memory to a second portion of the second memory; and clear the flag corresponding to the first data.

In one embodiment, the processing device is further configured to: refresh the first data in the second memory; and after refreshing the first data, clear the flag corresponding to the first data.

In one embodiment, the first data is received from a host device (e.g., 205).

In one embodiment, a storage density of the first memory is less than a storage density of the second memory.

In one embodiment, the temperature sensor is part of a flash storage device, the first memory includes single-level cells, and the second memory includes triple-level cells.

In one embodiment, a memory device includes the first memory; the temperature sensor is configured to provide data indicative of a temperature of the memory device; and evaluating the data received from the temperature sensor includes determining that the temperature of the memory device is outside of a defined operating range.

In one embodiment, the system is a flash memory device, the first data is received from a host device, and the processing device is further configured to: provide a notification to the host device when a temperature of the flash memory device exceeds a defined boundary (e.g., low and/or high temperature determined by host device 205, and set by processing device 204 based on signaling from host device 205 over a communication bus of vehicle 202). Evaluating the data received from the temperature sensor includes determining that the temperature of the flash memory device exceeds the defined boundary.

In one embodiment, the processing device is further configured to: receive a new temperature from the host device; update the defined boundary using the new temperature; and determine that the temperature of the flash memory device exceeds the updated defined boundary.

In one embodiment, the temperature of the flash memory device exceeds the defined boundary when above a defined high temperature (e.g., $T_{high}$), or below a defined low temperature (e.g., $T_{low}$).

In one embodiment, the host device is configured to, in response to receiving the notification, send a control signal to the processing device; and the processing device is further configured to, in response to receiving the control signal, control heating or cooling of the flash memory device.

In one embodiment, the system further includes a heating or cooling system (e.g., 220, 222), wherein controlling heating or cooling of the flash memory device includes controlling operation of the heating or cooling system.

In one embodiment, the system is a flash memory device, the first data is received from a host device, and the processing device is further configured to: in response to determining that the usage exceeds the threshold, send a notification to the host device. The host device is configured to, in response to receiving the notification, reduce an extent of data sent to the flash memory device for storage.

In one embodiment, the host device and the processing device are each mounted in a vehicle (e.g., 202), and reducing the extent of data includes the host device restricting one or more functions for an operational system of the vehicle.

The disclosure includes various devices which perform the methods and implement the systems described above, including data processing systems which perform these methods, and computer-readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of computer-readable medium used to actually effect the distribution.

At least some aspects disclosed can be embodied, at least in part, in software. That is, the techniques may be carried out in a computing device or other system in response to its processing device, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures. Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.). A "computer-readable medium" as used herein may include a single medium or multiple media (e.g., that store one or more sets of instructions).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. An apparatus comprising:
   first memory having memory cells, each cell configured to store charge representative of a single bit;
   second memory having memory cells, each cell configured to store charge representative of two or more bits;
   a temperature sensor; and
   a controller configured to:
      receive signaling corresponding to first data to be written to the first memory or the second memory;
      determine, based on a signal from the temperature sensor, whether a temperature of a memory device comprising the first memory and second memory is greater than or equal to a threshold value;
      in response to determining that the temperature of the memory device is greater than or equal to the threshold value, determine a status of the first memory or the second memory for storing data;
      write, based on the determined status, the first data to the second memory, and configure a register or portion of the second memory with an indicator associated with the first data;
      after writing the first data to the second memory, determine that the temperature of the memory device is less than the threshold value; and
      in response to determining that the temperature is less than the threshold value, perform a refresh operation on the second memory and reconfigure the register or portion of the second memory with the indicator.

2. The apparatus of claim 1, wherein:
   the first data is written into a first portion of the second memory; and
   performing the refresh operation on the second memory comprises moving the first data to a second portion of the second memory.

3. The apparatus of claim 1, wherein:
   determining whether the temperature of the memory device is greater than or equal to the threshold value is performed in response to receiving the signaling; and
   determining the status of the first memory or the second memory is based on a size of the first data.

4. The apparatus of claim 1, wherein the register or portion of the second memory is configured with the indicator to indicate that the first data is potentially unreliable, and the register or portion of the second memory with the indicator is reconfigured to indicate that the refresh operation has been performed when the temperature is less than the threshold value.

5. The apparatus of claim 1, wherein the first memory is a portion of the second memory, and operation of the portion is configured so that each memory cell in the portion stores charge representative of a single bit.

6. The apparatus of claim 1, wherein the first data is received from a host device, and the threshold value is determined by the controller based on a temperature received from the host device.

7. The apparatus of claim 1, wherein:
   second data has been written into the first memory when the temperature of the memory device is greater than or equal to the threshold value; and
   the controller is further configured to, in response to determining that the temperature is less than the threshold value, move the second data from the first memory to the second memory.

8. The apparatus of claim 1, wherein the memory device is a flash storage device, the memory cells of the first memory are single-level cells, and the memory cells of the second memory are triple-level cells or quad-level cells.

9. The apparatus of claim 1, wherein determining the status of the first memory or the second memory comprises determining that a usage of the first memory is greater than a threshold.

10. The apparatus of claim 9, wherein the first data is received from a host device, and the controller is further configured to send, to the host device, an indication that the usage of the first memory is greater than the threshold.

11. The apparatus of claim 10, wherein the host device, in response to receiving the indication, reduces an extent of write commands sent to the memory device.

12. The apparatus of claim 1, wherein the controller is further configured to:
   receive second data to be written; and
   in response to determining that the temperature is less than the threshold value, write the second data into the second memory.

13. The apparatus of claim 1, wherein the temperature sensor is configured to monitor an internal temperature of the memory device.

14. The apparatus of claim 1, wherein the threshold value is 70 degrees Celsius.

15. A system comprising:
a temperature sensor; and
a processing device configured to:
evaluate a signal received from the temperature sensor;
select, based on evaluating the signal received from the temperature sensor, a first memory for storing data;
after selecting the first memory, determine that usage of the first memory exceeds a threshold;
in response to determining that the usage exceeds the threshold, write first data into a second memory; and
configure a register or portion of the second memory with an indicator corresponding to the first data written into the second memory, the indicator indicating a reduced reliability of the first data.

16. The system of claim 15, wherein:
a memory device comprises the first memory and the second memory;
evaluating the data comprises determining that a temperature of the memory device is outside of a defined operating range; and
the processing device is further configured to:
receive a new signal from the temperature sensor;
determine, based on the new data, that the temperature of the memory device is inside the defined operating range;
in response to determining that the temperature of the memory device is inside the defined operating range, move the first data from a first portion of the second memory to a second portion of the second memory; and
reconfigure the register or portion of the second memory with the indicator corresponding to the first data.

17. The system of claim 15, wherein the processing device is further configured to:
perform a refresh operation on the second memory; and
after performing the refresh operation, reconfigure the register or portion of the second memory with the indicator corresponding to the first data.

18. The system of claim 15, wherein the first data is received from a host device.

19. The system of claim 15, wherein a storage density of the first memory is less than a storage density of the second memory.

20. The system of claim 15, wherein the temperature sensor is part of a flash storage device, the first memory comprises single-level cells, and the second memory comprises triple-level cells or quad-level cells.

21. The system of claim 15, wherein:
a memory device includes the first memory;
the temperature sensor is configured to provide a signal indicative of a temperature of the memory device; and
evaluating the signal received from the temperature sensor comprises determining that the temperature of the memory device is greater than or equal to a threshold value.

22. The system of claim 15, wherein the system is a flash memory device, the first data is received from a host device, and the processing device is further configured to:
provide a notification to the host device when a temperature of the flash memory device exceeds a defined boundary;
wherein evaluating the signal received from the temperature sensor comprises determining that the temperature of the flash memory device exceeds the defined boundary.

23. The system of claim 22, wherein the processing device is further configured to:
receive a new temperature from the host device;
update the defined boundary using the new temperature; and
determine that the temperature of the flash memory device exceeds the updated defined boundary.

24. The system of claim 22, wherein the temperature of the flash memory device exceeds the defined boundary when above a defined high temperature, or below a defined low temperature.

25. The system of claim 22, wherein:
the host device is configured to, in response to receiving the notification, send a control signal to the processing device; and
the processing device is further configured to, in response to receiving the control signal, control heating or cooling of the flash memory device.

26. The system of claim 25, further comprising a heating or cooling system, wherein controlling heating or cooling of the flash memory device comprises controlling operation of the heating or cooling system.

27. The system of claim 15, wherein the system is a flash memory device, the first data is received from a host device, and the processing device is further configured to:
in response to determining that the usage exceeds the threshold, send a notification to the host device;
wherein the host device is configured to, in response to receiving the notification, reduce an extent of data sent to the flash memory device for storage.

28. The system of claim 27, wherein the host device and the processing device are each mounted in a vehicle, and reducing the extent of data comprises the host device restricting one or more functions for an operational system of the vehicle.

29. A method comprising:
receiving first data to be written into a memory device, the memory device comprising first memory and second memory;
determining, based on a signal from at least one sensor of the memory device, whether a temperature is greater than or equal to a threshold value;
in response to determining that the temperature is greater than or equal to the threshold value, determining a usage status of the first memory or the second memory;
storing, based on the determined usage status, the first data in the second memory;
after storing the first data, determining that the temperature is less than the threshold value; and
in response to determining that the temperature is less than the threshold value, performing a refresh operation on the second memory.

30. The method of claim 29, further comprising:
configuring a register or portion of the second memory with an indicator to indicate a temporary status of the written first data; and
after performing the refresh operation, reconfiguring the register or portion of the second memory with the indicator.

31. The method of claim 29, wherein the memory device is mounted in a vehicle, the method further comprising:
determining an operating status of the vehicle; and adjusting, based on the determined operating status of the vehicle, the threshold value.

32. The method of claim 31, wherein determining the operating status comprises determining that the vehicle is powered for travel along a road.

33. The method of claim 29, further comprising, in response to determining that the temperature is greater than or equal to the threshold value, causing activation of an air conditioning system that cools the memory device.

* * * * *